(12) United States Patent
Chen et al.

(10) Patent No.: US 10,912,210 B2
(45) Date of Patent: Feb. 2, 2021

(54) DISPLAY DEVICE

(71) Applicant: Qisda Corporation, Taoyuan (TW)

(72) Inventors: Chia-Pao Chen, Taoyuan (TW); Wei-Shin Shiu, Taoyuan (TW)

(73) Assignee: Qisda Corporation, Taoyuan (TW)

(*) Notice: Subject to any disclaimer, the term of this patent is extended or adjusted under 35 U.S.C. 154(b) by 0 days.

(21) Appl. No.: 16/699,208

(22) Filed: Nov. 29, 2019

(65) Prior Publication Data
US 2020/0229314 A1 Jul. 16, 2020

(30) Foreign Application Priority Data
Jan. 16, 2019 (CN) .......................... 2019 1 0038675

(51) Int. Cl.
| | | |
|---|---|---|
| *H05K 7/02* | (2006.01) | |
| *H05K 7/04* | (2006.01) | |
| *H05K 5/02* | (2006.01) | |
| *F16M 11/04* | (2006.01) | |
| *F16M 11/06* | (2006.01) | |
| *F16M 11/22* | (2006.01) | |
| *F16M 13/02* | (2006.01) | |
| *H05K 5/00* | (2006.01) | |

(52) U.S. Cl.
CPC .......... *H05K 5/0204* (2013.01); *F16M 11/04* (2013.01); *F16M 11/06* (2013.01); *F16M 11/22* (2013.01); *F16M 13/02* (2013.01); *H05K 5/0017* (2013.01); *H05K 5/0234* (2013.01); *H05K 5/0247* (2013.01); *F16M 2200/08* (2013.01)

(58) Field of Classification Search
USPC ........................................ 361/809, 807, 810
See application file for complete search history.

(56) References Cited

U.S. PATENT DOCUMENTS

| | | | | |
|---|---|---|---|---|
| 2005/0039889 A1* | 2/2005 | Huang | .................... | G06F 1/203 165/104.33 |
| 2007/0002529 A1* | 1/2007 | Drew | .................... | G06F 1/1601 361/679.22 |
| 2009/0315837 A1* | 12/2009 | Geiger | .................. | G06F 1/1607 345/173 |

FOREIGN PATENT DOCUMENTS

CN 207674062 U 7/2018

OTHER PUBLICATIONS

Office action of counterpart application by SIPO dated May 15, 2020.

* cited by examiner

*Primary Examiner* — Hung S. Bui

(57) ABSTRACT

A display device including a screen, a base and an adaptor is provided. The adaptor can be selectively detached from or connected to the screen and the base. When the base is connected to the screen through the adaptor, the display device is erected on a plane through the base. When the base and the screen are directly connected, the display device is attached to a wall through the base. Thus, the screen and the base can switch between a stand-up mode or a hanging mode through the adaptor.

20 Claims, 12 Drawing Sheets

DISPLAY DEVICE

This application claims the benefit of People's Republic of China application Serial No. 201910038675.8, filed on Jan. 16, 2019, the subject matter of which is incorporated herein by reference.

BACKGROUND OF THE INVENTION

Field of the Invention

The invention relates in general to a display device, and more particularly to a display device with an adaptor.

Description of the Related Art

Most conventional display devices are stand-up displays, which can be placed on a desktop. However, if the user would like to hang the display on the wall, the user needs to purchase a display with a hanging structure, which is a waste in terms of cost.

SUMMARY OF THE INVENTION

The invention is directed to a display device capable of resolving the abovementioned problems encountered in the prior art.

According to an embodiment of the present invention, a display device is provided. The display device includes a screen, a base and an adaptor. The adaptor can be selectively detached from or connected to the screen and the base. When the base is connected to the screen through the adaptor, the display device is erected on a plane through the base. When the base and the screen are directly connected, the display device is attached to a wall through the base.

According to another embodiment of the present invention, a display device is provided. The display device includes a screen, a base and an adaptor. The screen has a display surface. The base has a bottom surface. The adaptor can be selectively detached from or connected to the screen and the base. When the base is connected to the screen through the adaptor, the bottom surface and the display surface are perpendicular to each other. When the base and the screen are directly connected, the bottom surface and the display surface are parallel to each other.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
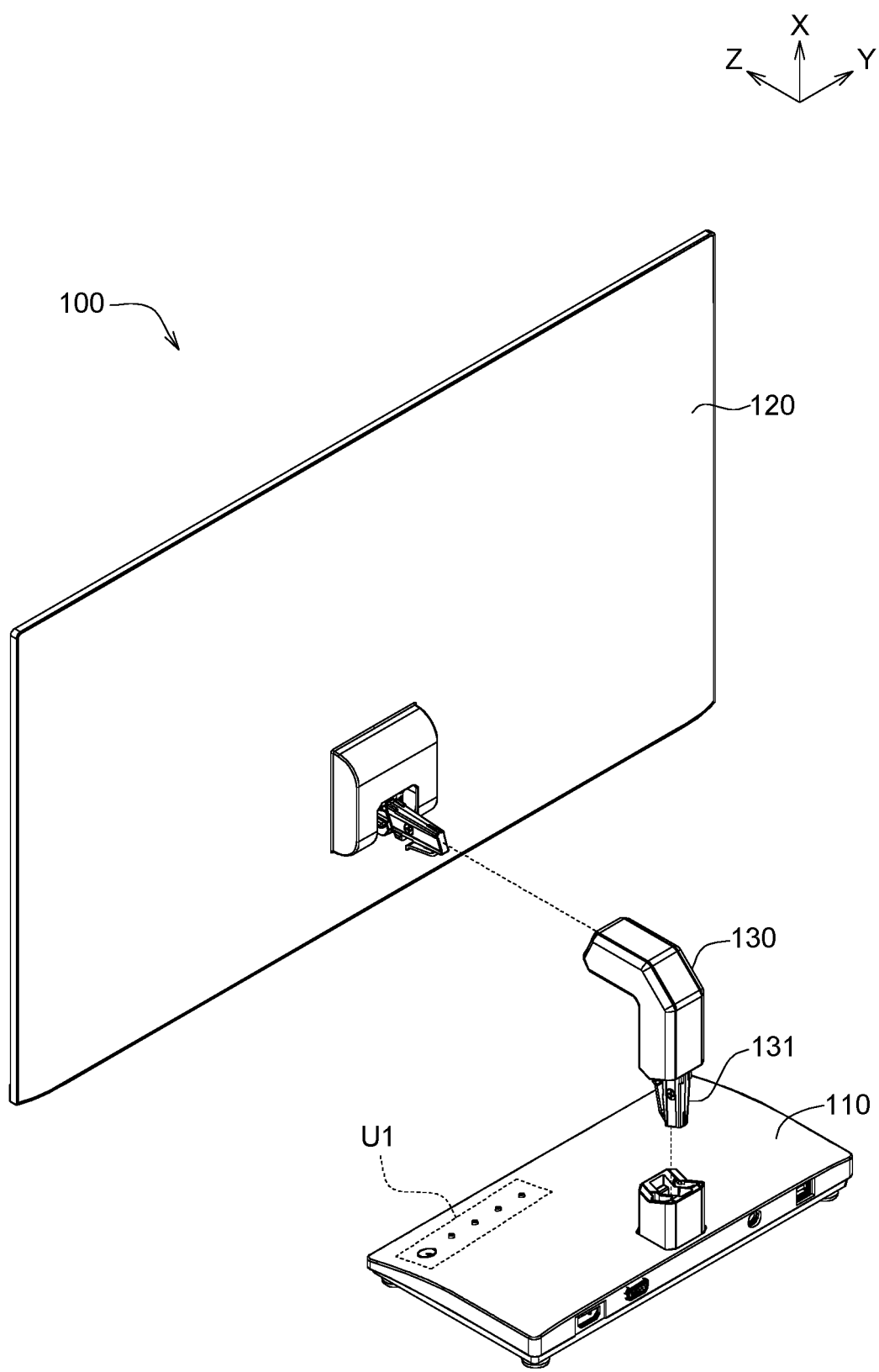
FIG. 1A is an explosion diagram of a display device according to an embodiment the present invention.
Figure 1B:
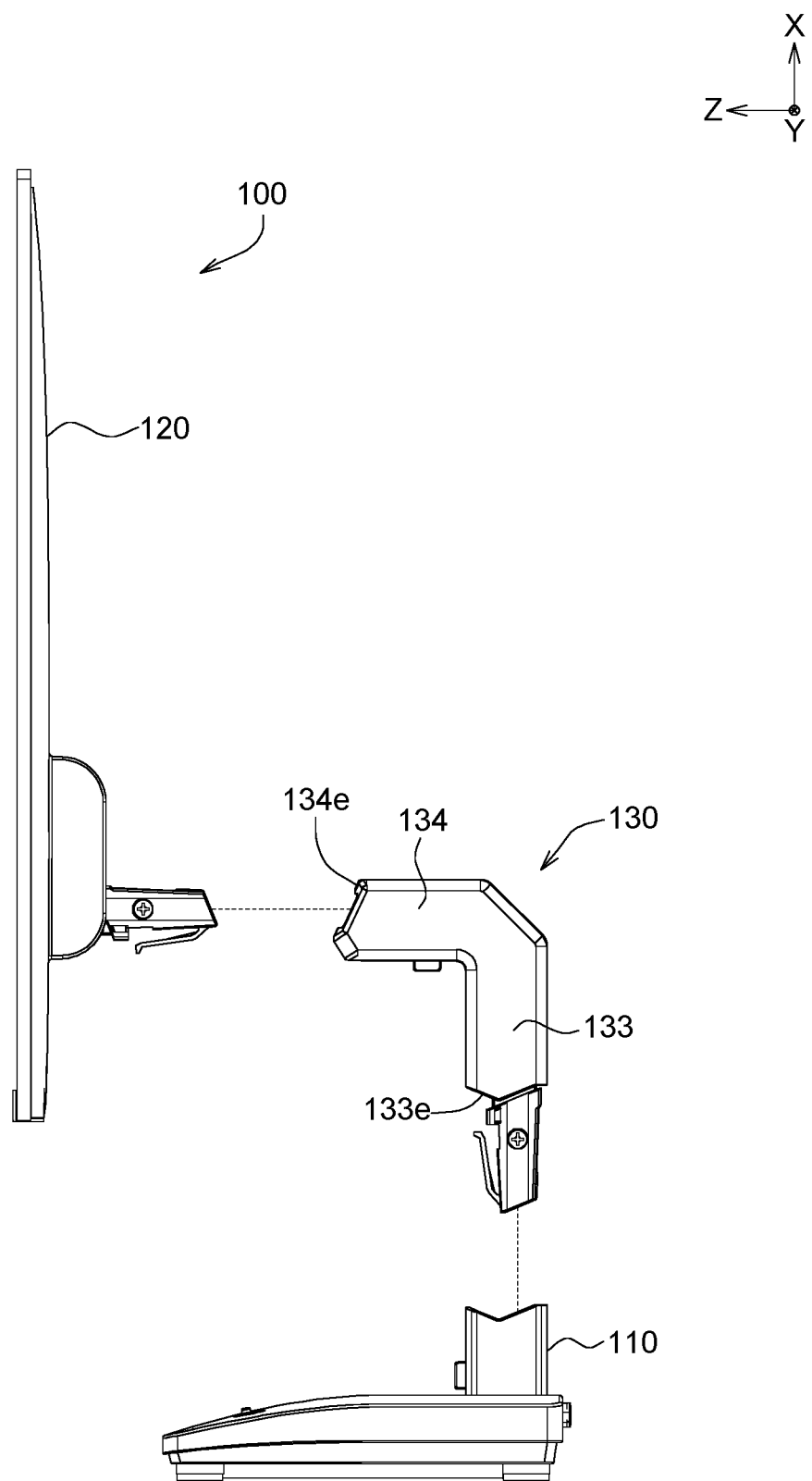
FIG. 1B is a side view of the display device of FIG. 1A.

Refer to FIGS. 1A and 1B. FIG. 1A is an explosion diagram of a display device 100 according to an embodiment the present invention. FIG. 1B is a side view of the display device 100 of FIG. 1A.

The display device 100 includes a base 110, a screen 120 and an adaptor 130. The adaptor 130 can be selectively detached from or connected to the screen 120 and the base 110. When the base 110 is connected to the screen 120 through the adaptor 130, the display device 100 can be erected on a plane through the base 110. The plane can be a desktop, a ground or other surface, such as a horizontal plane, on which the display device 100 can be erected. When the base 110 and the screen 120 are directly connected (that is, without using the adaptor 130), the display device 100 can be attached to a wall through the base 110.

An embodiment in which the base 110 and the screen 120 are directly connected is disclosed below.

Figure 2A:
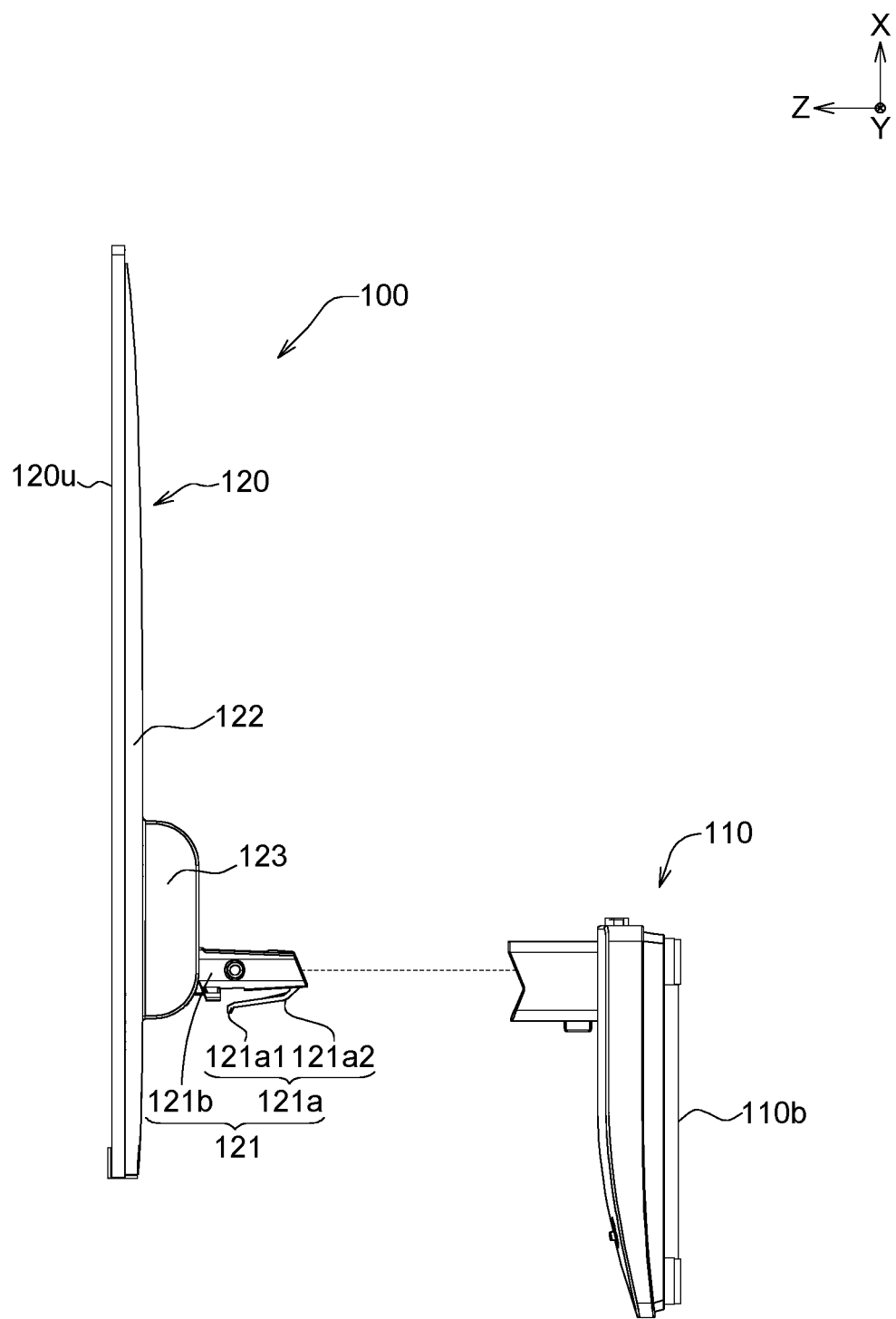
FIG. 2A is an explosion diagram of the base and the screen of FIG. 1A.
Figure 2B:
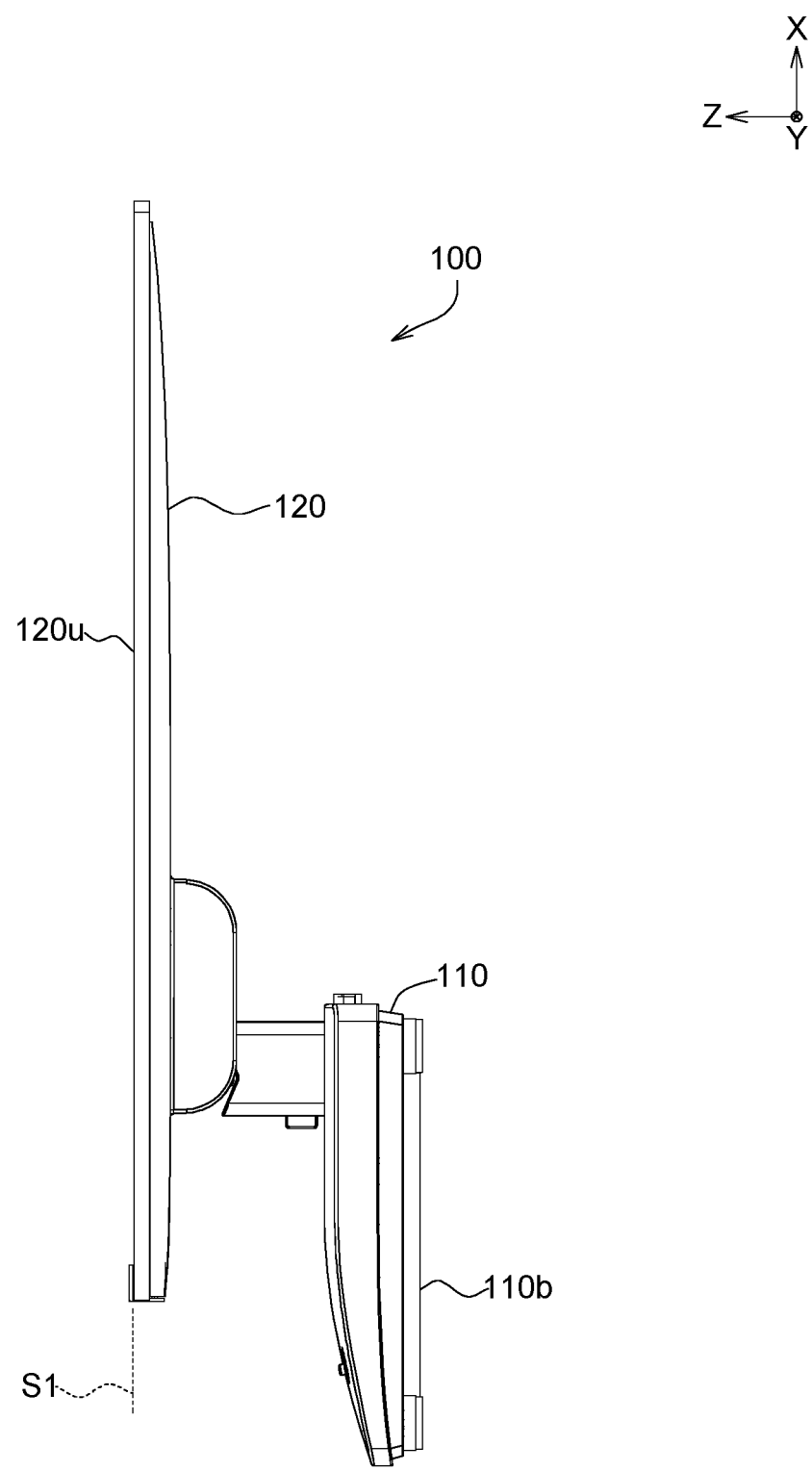
FIG. 2B is an assembly diagram of the base and the screen of FIG. 2A.
Figure 2C:
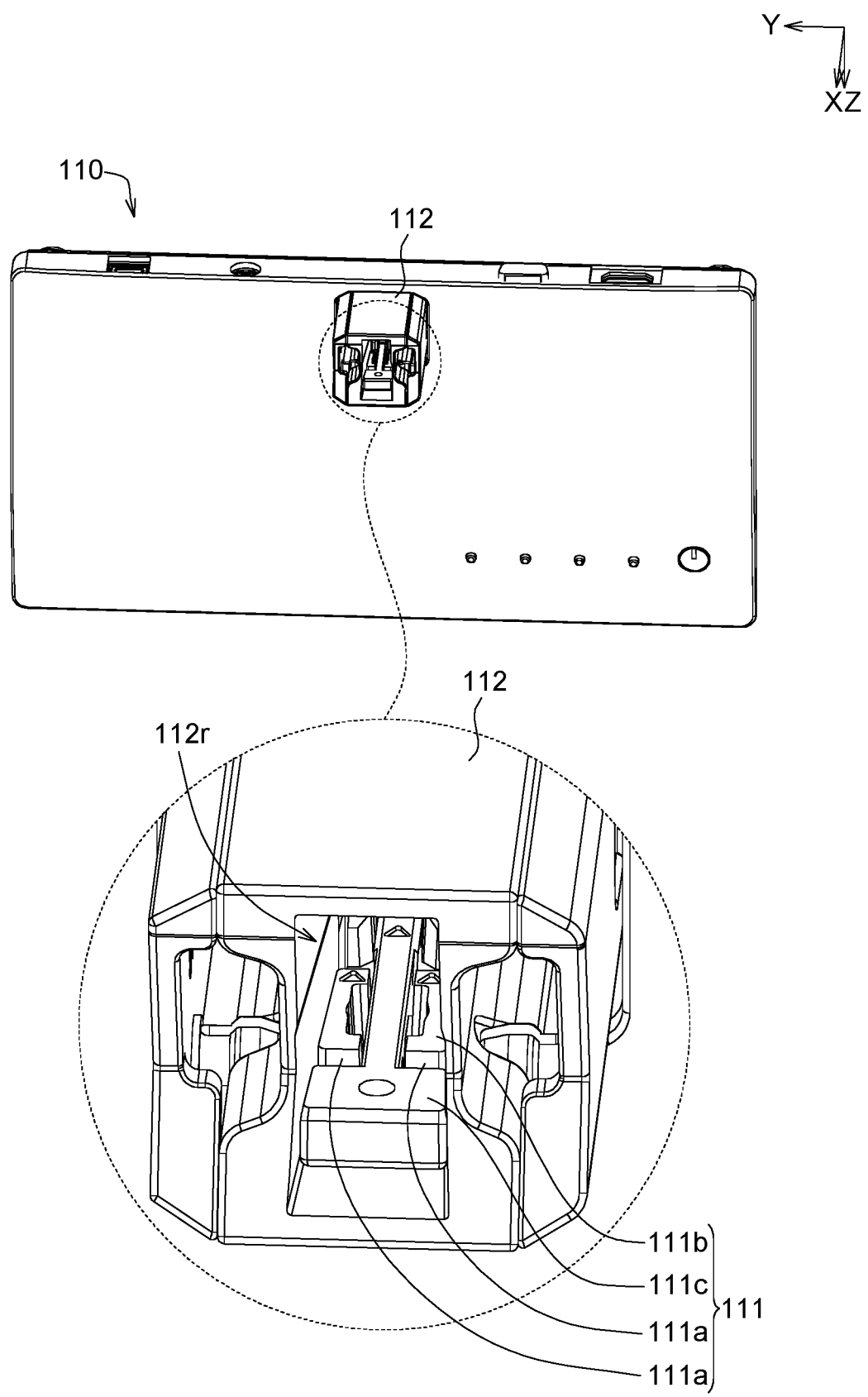
FIG. 2C is a 3D diagram of the base of FIG. 2B.

Refer to FIGS. 2A to 2C. FIG. 2A is an explosion diagram of the base 110 and the screen 120 of FIG. 1A. FIG. 2B is an assembly diagram of the base 110 and the screen 120 of FIG. 2A. FIG. 2C is a 3D diagram of the base of FIG. 2B. The base 110 includes a first connector 111 and a base body 112, wherein the first connector 111 is disposed in the base body 112. The screen 120 includes a second connector 121, a screen body 122 and a connector base 123, wherein connector base 123 is disposed on the back side of the screen body 122, and the second connector 121 is disposed on the connector base 123.

When the base 110 and the screen 120 are directly connected, the first connector 111 and the second connector 121 are directly connected. As indicated in FIG. 2B, the screen 120 has a display surface 120u, and the base 110 has a bottom surface 110b. When the base 110 and the screen 120 are directly connected, the bottom surface 110b and the display surface 120u substantially are parallel to each other. The display device 100 can be disposed on (hanged on or attached to) the wall through the holes on the bottom surface 110b or the pitch complying with the VESA standard. When the display device 100 is disposed on the wall through the bottom surface 110b, the display surface 120u is perpendicular to the wall and faces the viewers in front of the wall.

As indicated in FIG. 2A, the first connector 111 of the base 110 can be realized by a female connector, and the second connector 121 of the screen 120 can be realized by a male connector matching the said female connector. The base 110 and the screen 120 can be coupled through the connection of the male connector and the female connector.

Although it is not illustrated in the diagram, the screen body 122 and the connector base 123 can be pivotally connected. That is, the screen body 122 can rotate around at least one of the Z axis, the X axis and the Y axis with respect to the base 110 to adjust the angle at which the viewer views the display surface 120u. In an embodiment, the screen body 122 and the connector base 123 can be pivotally connected through a connector (not illustrated) which allows the screen body 122 to rotate around at least one of the Z axis, the X axis and the Y axis with respect to the base 110. The connector can be realized by a spherical connector, a cylindrical connector or other suitable connector.

As indicated in FIG. 2C, the first connector 111 of the base 110 has at least one first engaging portion 111a, a release portion 111b and a limiting portion 111c. The limiting portion 111c is fixed in the base body 112. The release portion 111b is disposed adjacent to the limiting portion 111c. The limiting portion 111c and the release portion 111b are separated by the first engaging portion 111a, which can be realized by a hole. As indicated in FIG. 2A, the second connector 121 of the screen 120 includes a second engaging portion 121a and a protruding portion 121b, wherein the second engaging portion 121a is connected to the protruding portion 121b. The second engaging portion 121a is engaged with the first engaging portion 111a. As indicated in FIG. 2A, the second engaging portion 121a has at least one hook 121a1 (only one hook 121a1 can be viewed in FIG. 2A) and an elastic arm 121a2 connected to the at least one hook 121a1, wherein the hook 121a1 is at the free end of the elastic arm 121a2, and the fixed end of the elastic arm 121a2 is fixed in the protruding portion 121b. As indicated in FIG. 2C, when the first connector 111 and the second connector 121 are coupled, the first engaging portion 111a (such as hole) and the hook 121a1 of the second engaging portion 121a are coupled together to fix the relative position between the base 110 and the screen 120. The embodiment below is disclosed with accompanying drawings FIGS. 3A to 3B.

Figure 3A:
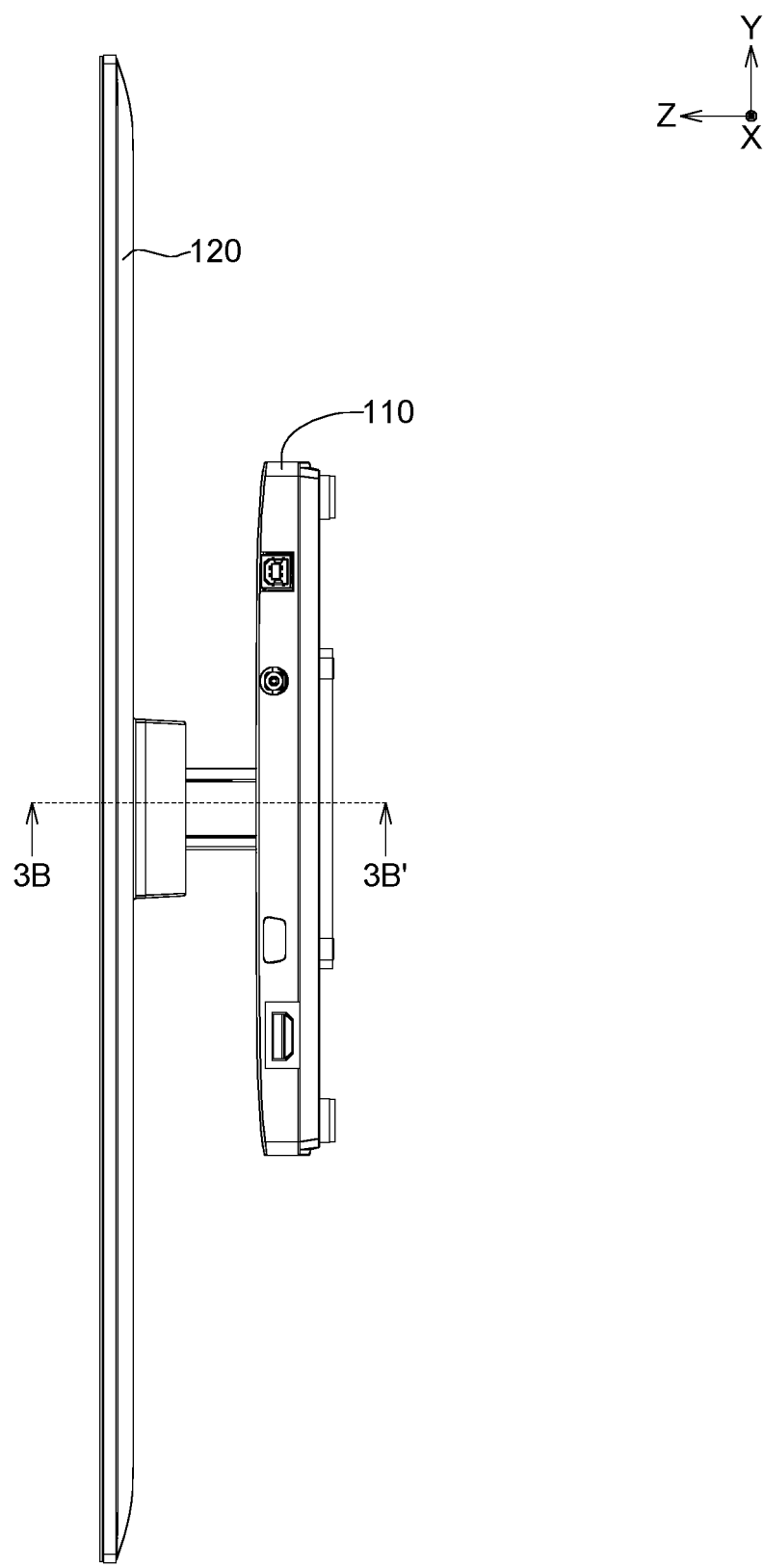
FIG. 3A is a schematic diagram of the display device of FIG. 2B viewed from another view angle.
Figure 3B:
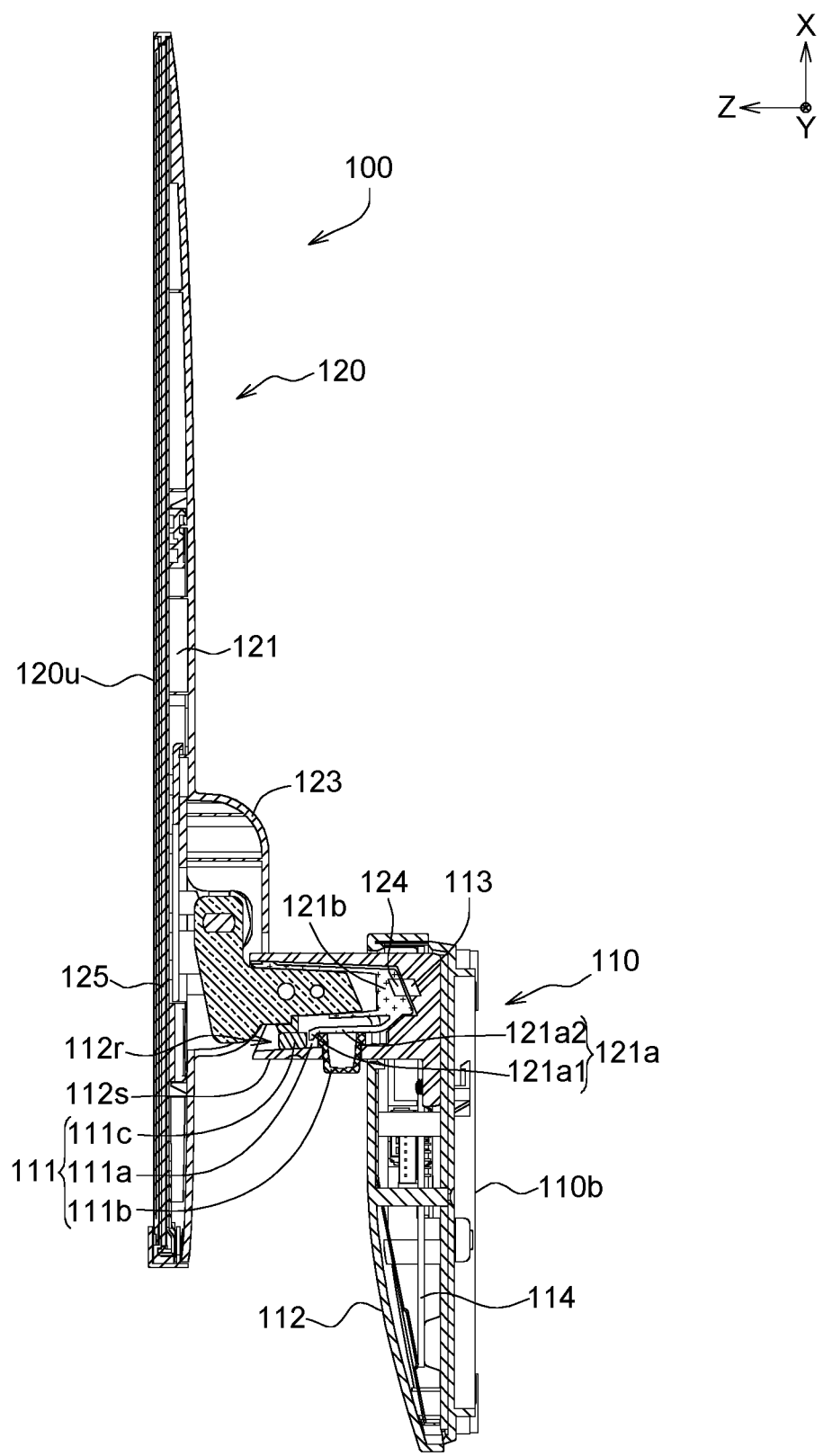
FIG. 3B is a cross-sectional view of the display device of FIG. 3A along a direction 3B-3B'.

Refer to FIGS. 3A to 3B. FIG. 3A is a schematic diagram of the display device 100 of FIG. 2B viewed from another view angle. FIG. 3B is a cross-sectional view of the display device 100 of FIG. 3A along a direction 3B-3B'. The release portion 111b of the first connector 111 is configured to dismiss the engaging relationship between the first connector 111 and the second connector 121. As indicated in FIG. 3B, when the first engaging portion 111a (such as hole) and the hook 121a1 of the second engaging portion 121a are engaged together, the release portion 111b is disposed close or adjacent to (such as contact) the elastic arm 121a2 of the second engaging portion 121a. The release portion 111b is exposed and projected from the outer surface 112s of the base body 112 so that the user can conveniently trigger the release portion 111b from outside the display device 100. When the release portion 111b is triggered (such as pressed), the release portion 111b is moved to push the elastic arm 121a2 inside the base 110 to dismiss the engaging relationship between the first engaging portion 111a and the hook 121a1 of the second engaging portion 121a, such that the screen 120 and the base 110 switch to a detachable state from a fixed state.

As indicated in FIGS. 2C and 3B, the base body 112 of the base 110 has a slot 112r. The protruding portion 121b of the second connector 121 can enter the slot 112r of the base body 112, such that the second engaging portion 121a disposed on the protruding portion 121b and the first engaging portion 111a disposed in the slot 112r can be engaged together.

As indicated in FIG. 3B, the base 110 further includes a first electric connection port 113, and the screen 120 further includes a second electric connection port 124. The first electric connection port 113 can be realized by one of a male connector and a female connector, and the second electric connection port 124 can be realized by the other one of the male connector and the female connector. When the first engaging portion 111a and the second engaging portion 121a are engaged together, the first electric connection port 123 and the second electric connection port 124 are connected, such that the base 110 and the screen 120 can be electrically connected through the first electric connection port 123 and the second electric connection port 124. As indicated in FIG. 3B, the base 110 further includes a control board 114 disposed in the base body 112 of the base 110 for controlling the screen 120. For example, the control board 114 can control the screen 120 through the first electric connection port 123 and the second electric connection port 124. In an embodiment, As indicated in FIG. 3B, the screen 120 includes a display panel 125 disposed in the screen body 121. Additionally, the control of the display panel 125 can be completely processed by the control board 114. In comparison to the arrangement of the control board 114 being disposed in the screen 120, the control board 114 is disposed outside the screen 120 in the embodiment of the present invention, such that the screen 120 can be designed thinner and lighter.

Although it is not illustrated in the diagram, the base 110 further includes at least one wire (not illustrated), which is electrically connected to the control board 114 and the first electric connection port 113. The screen 120 further includes at least one wire (not illustrated), which is disposed in the screen body 121 for electrically connecting the display panel 125 and the second electric connection port 124. When the first electric connection port 113 and the second electric connection port 124 are connected, the control board 114 and the display panel 125 can be electrically connected through the wires.

In an embodiment, the base 110 further includes an operation interface U1 (illustrated in FIG. 1A) configured to receive an instruction inputted by the user. The control board 114 controls the display mode of the screen 120, the power switch and/or the volume according to the inputted instruction. The operation interface U1 of FIG. 1A may further include at least one physical button and/or at least one virtual button, which is electrically connected to the control board 114 for receiving the instruction inputted by the user. Or, the operation interface U1 can be realized by a touch panel for receiving the instruction inputted by the user.

Figure 4A:
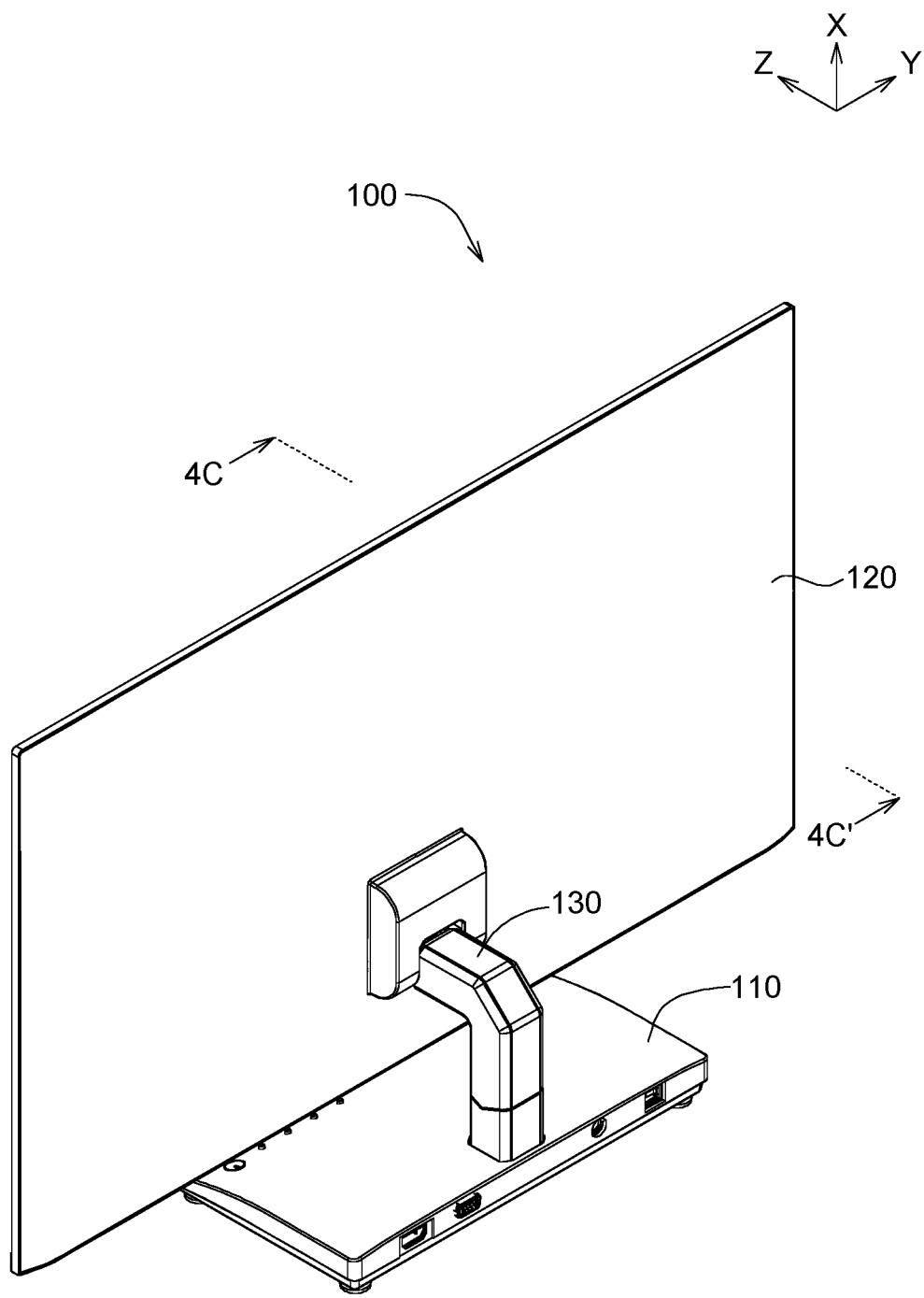
FIG. 4A is an assembly diagram of the base and the screen of FIG. 1A indirectly connected through an adaptor.
Figure 4B:
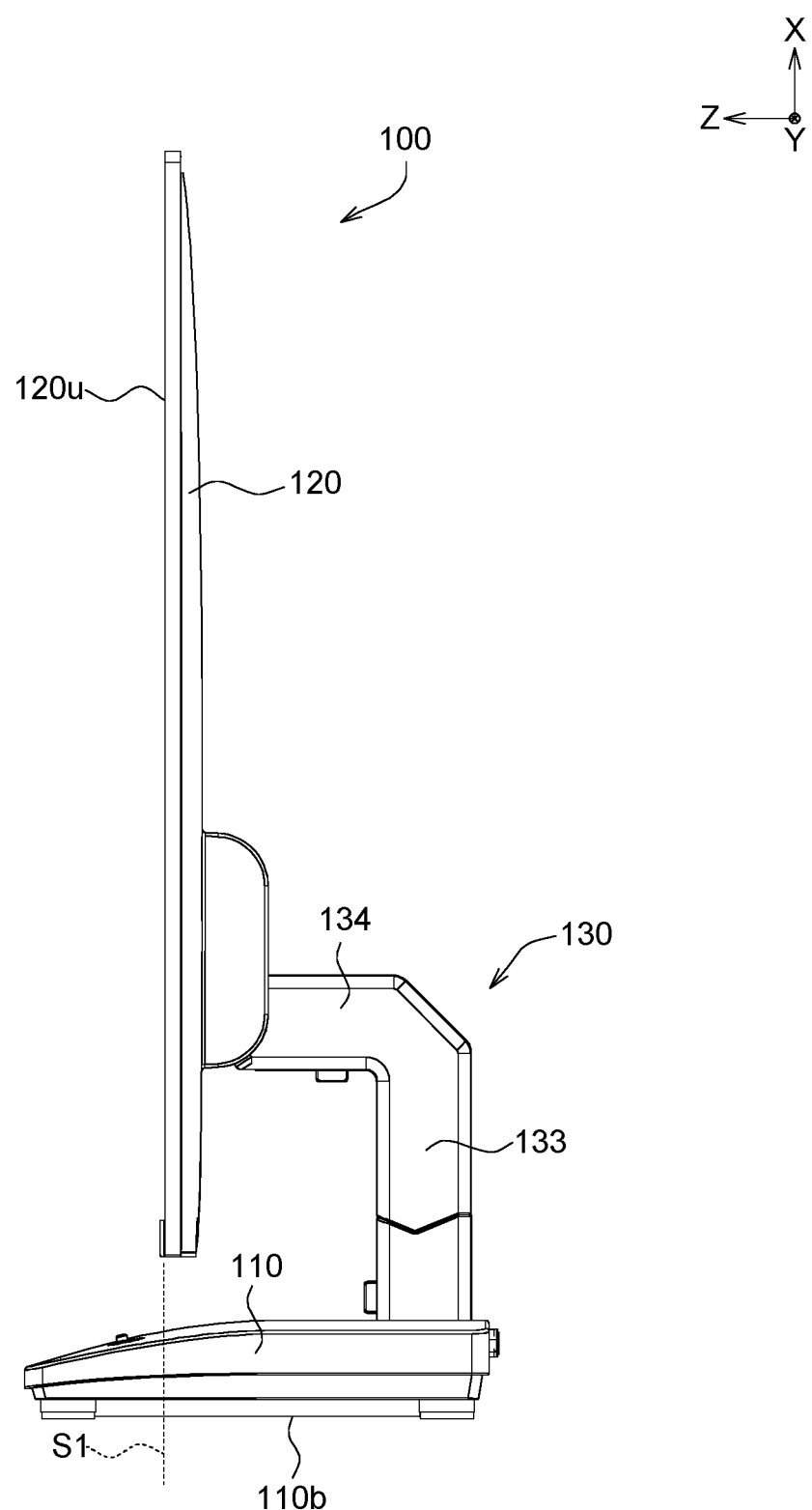
FIG. 4B is a side view of the display device of FIG. 4A.
Figure 4C:
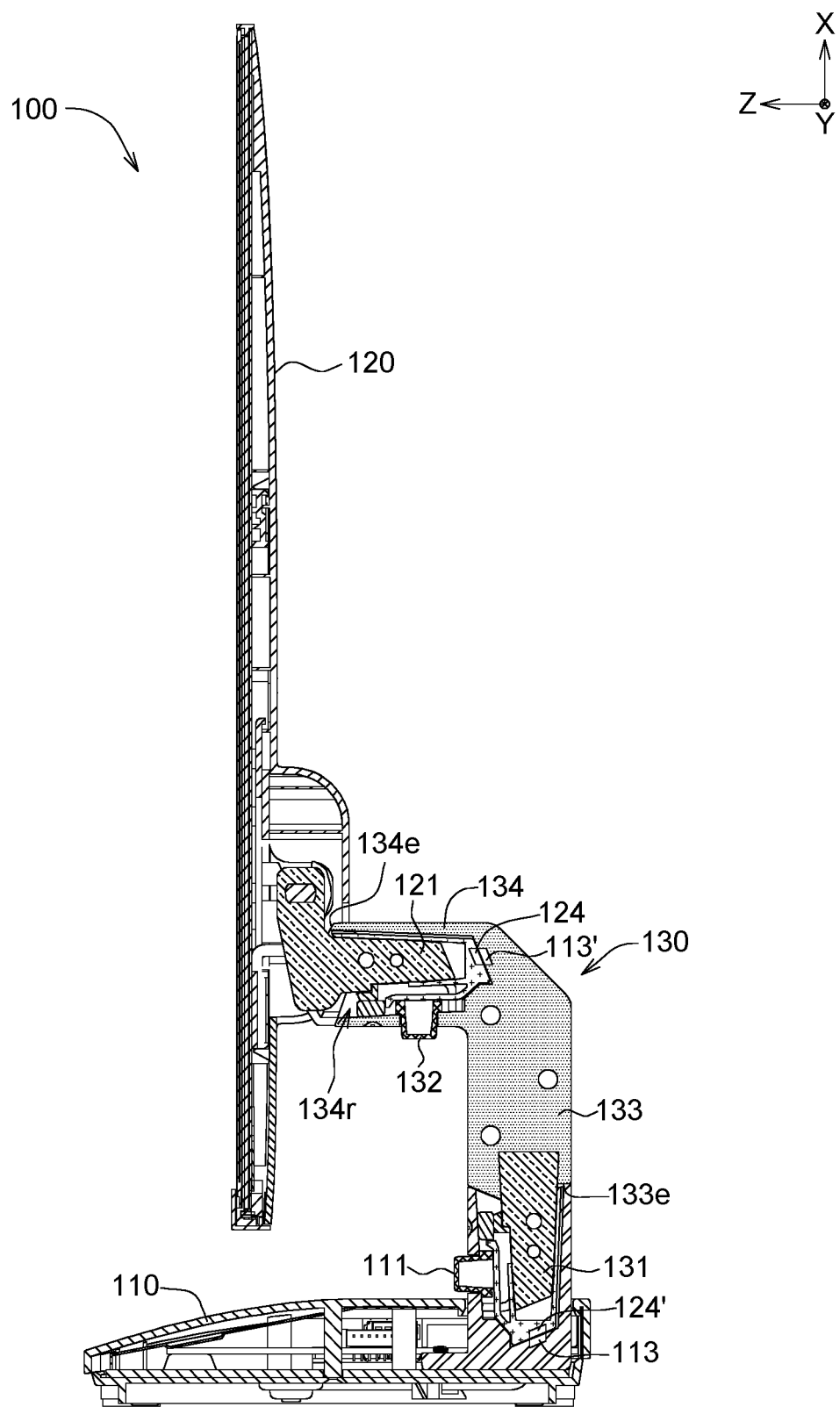
FIG. 4C is a cross-sectional view of the display device of FIG. 4A along a direction 4C-4C'.

Refer to FIGS. 4A to 4C. FIG. 4A is an assembly diagram of the base 110 and the screen 120 of FIG. 1A indirectly connected through an adaptor 130. FIG. 4B is a side view of the display device 100 of FIG. 4A. FIG. 4C is a cross-sectional view of the display device 100 of FIG. 4A along a direction 4C-4C'.

The adaptor 130 includes a third connector 131, a fourth connector 132, a third electric connection port 113' and a fourth electric connection port 124'. When the screen 120 and the base 110 are indirectly connected through the adaptor 130, the adaptor 130 is connected to the first connector 111 of the base 110 and the second connector 121 of the screen 120 through the third connector 131 and the fourth connector 132 respectively. In an embodiment, the structures of the third connector 131 and the fourth connector 132 of the adaptor 130 respectively are similar or identical to that of the second connector 121 and the first connector 111, and the similarities are not repeated here.

The adaptor 130 has an L-shape. The comparison between FIG. 4B and FIG. 2B shows that the adaptor 130 can change the relative direction between the display surface 120u of the screen 120 and the base 110. As indicated in FIG. 2B, when the screen 120 and the base 110 are directly connected, the extending direction of S1 of the display surface 120u of the screen 120 does not pass through the bottom surface 110b of the base 110. For example, the screen 120 and the base 110 substantially are parallel to each other. As indicated in FIG.

4B, when the screen 120 and the base 110 are indirectly connected through the adaptor 130, the extending direction of S1 of the display surface 120u of the screen 120 passes through the bottom surface 110b of the base 110. For example, the screen 120 and the base 110 substantially are perpendicular to each other. In another embodiment, the shape of the adaptor 130 is not limited to the L-shape. For example, the adaptor 130 may have a U-shape, a V-shape or other geometric shape that suits different occasions.

As indicated in FIG. 4C, the third electric connection port 113' and the fourth electric connection port 124' of the adaptor 130 are respectively connected to the second electric connection port 124 of the screen 120 and the first electric connection port 113 of the base 110, such that the base 110 and the screen 120 can be electrically connected through the adaptor 130. Although it is not illustrated in the diagram, the adaptor 130 further includes at least one wire, which electrically connects the third electric connection port 113' and the fourth electric connection port 124'. When the screen 120 and the base 110 are connected through the adaptor 130, the control board 114 of the base 110 can be electrically connected to the display panel 125 of the screen 120 through the first electric connection port 113, the fourth electric connection port 124', the third electric connection port 113', the fourth electric connection port 124' and the connecting wire thereof.

Moreover, the third electric connection port 113' has a first identical structure identical to the first electric connection port 113, and the fourth electric connection port 124' has a second identical structure identical to the second electric connection port 124, wherein the first identical structure can be one of a male connector and a female connector, and the second identical structure can be the other one of the male connector and the female connector.

As indicated in FIGS. 4B and 4C, the adaptor 130 includes a first portion 133 and a second portion 134 connected to each other. The first portion 133 has a first terminal surface 133e. The third connector 131 is projected from the first terminal surface 133e. The second portion 134 has a second terminal surface 134e and a slot 134r, wherein the slot 134r is recessed into the second terminal surface 134e, and the fourth connector 132 is disposed in the slot 134r. The structure of the slot 134r of the second portion 134 is similar to that of the slot 112r of the base body 112, and the similarities are not repeated here. In an embodiment, although it is not illustrated in the diagram, the first portion 133 and the second portion 134 can be pivotally connected, such that the screen body 122 can rotate around at least one of the Z axis, the X axis and the Y axis with respect to the base 110 to adjust the angle at which the viewer views the display surface 120u. In an embodiment, the first portion 133 and the second portion 134 can be pivotally connected through a connector (not illustrated), which allows the screen body 122 to rotate around at least one of the Z axis, the X axis and the Y axis with respect to the base 110. The connector can be realized by a spherical connector, a cylindrical connector or other suitable connector.

Figure 5A:
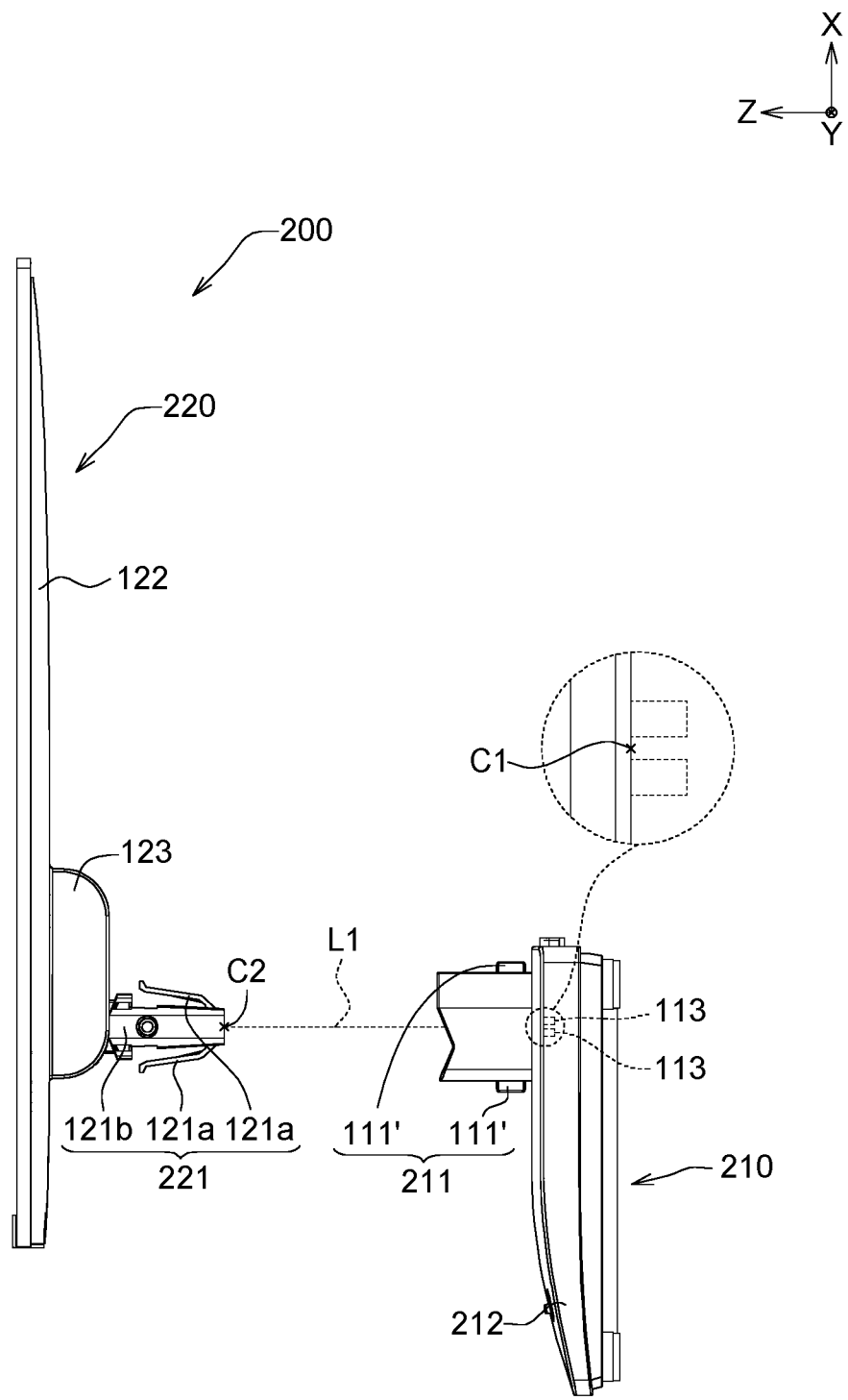
FIG. 5A is an explosion diagram of a display device according to another embodiment the present invention.
Figure 5B:
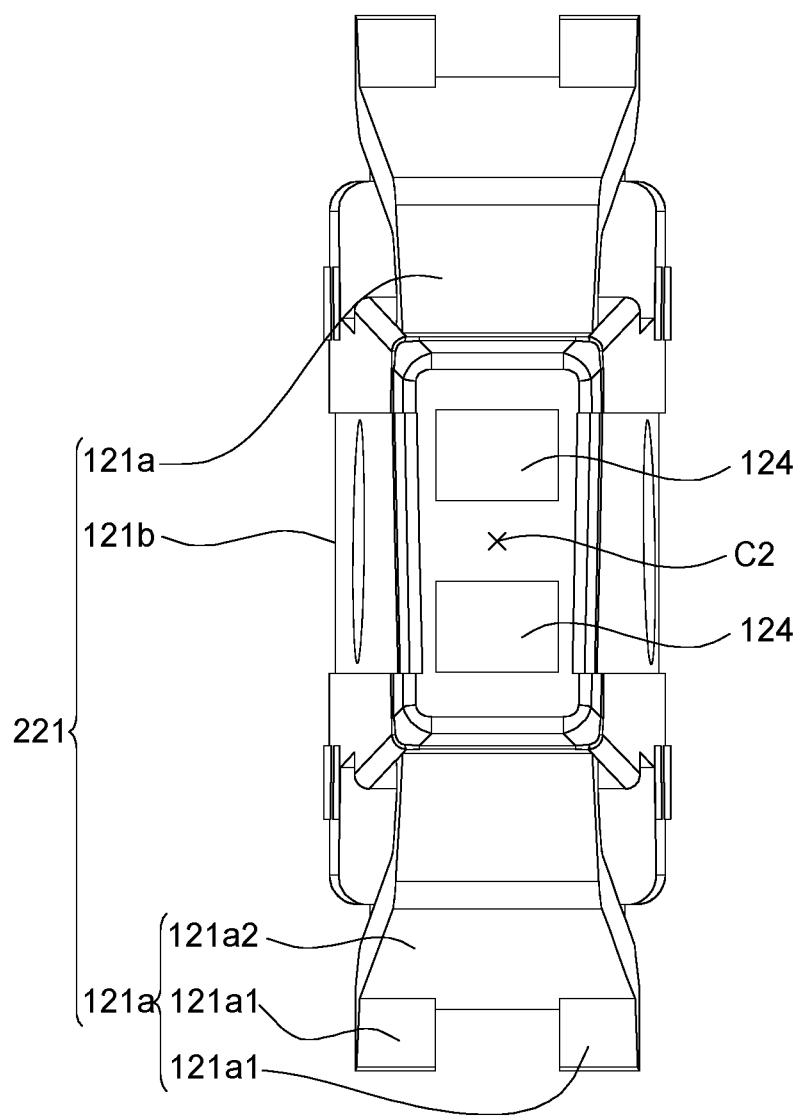
FIG. 5B is a front view of the second connector of FIG. 5A.

Refer to FIGS. 5A and 5B. FIG. 5A is an explosion diagram of a display device 200 according to another embodiment the present invention. FIG. 5B is a front view of the second connector 221 of FIG. 5A. The display device 200 includes a base 210, a screen 220 and an adaptor (not illustrated). The base 210 includes a first connector 211 and a base body 212, wherein the first connector 211 is disposed in the base body 212. The screen 120 includes a second connector 221, a screen body 122 and a connector base 123, wherein the second connector 221 is disposed on the connector base 123. The first engaging portion 111a, the release portion 111b and the limiting portion 111c of FIG. 2C can form an engaging set 111'. The first connector 211 of FIG. 5A includes two engaging sets 111' disposed oppositely. The second connector 221 has two second engaging portions 121a disposed oppositely. The two second engaging portions 121a are respectively connected to two opposite sides of the protruding portion 121b. One of the two first engaging portions 111a (the first engaging portion 111a illustrated in FIG. 2C) of the two engaging sets 111' is engaged with one of the two second engaging portions 121a. The other one of the two first engaging portions 111a (the first engaging portion 111a illustrated in FIG. 2C) of the two engaging sets 111' is engaged with the other one of the two second engaging portions 121a. To put it in greater details, the first connector 211 and the second connector 221 can be selectively connected at a first angle or a second angle, wherein the first angle and the second angle differ with each other by 180. That is, the screen 220 and the base 210 can be connected at the stance as indicated in FIG. 5A. Or, as indicated in FIG. 5A, the screen 220 and the base 210 can rotate by 180° with respect to the docking axis L1 (substantially parallel to the Z axis) before the screen 220 and the base 210 can be connected.

Suppose the first connector 211 and the second connector 221 are engaged with each other. To dismiss the engaging relationship between the base 210 and the screen 220, the two release portions 111b triggering the two engaging sets 111' can be pressed at simultaneously (the two release portions 111b are pressed at the same time) or sequentially (one of the two release portions 111b is pressed first and the other one of the two release portions 111b is pressed later). Thus, the engaging relationship between the base 210 and the screen 220 can be dismissed.

As indicated in FIG. 5A, the base 210 further includes two first electric connection ports 113 disposed in the base 210. As indicated in FIG. 5B, the screen 220 further includes two second electric connection ports 124 disposed on the terminal surface of the protruding portion 121b. When the base 210 and the screen 220 are connected at the first stance (such as one of the first angle and the second angle), the first one and the second one of the two first electric connection ports 113 are respectively connected to the first one and the second one of the two second electric connection ports 124. When the base 210 and the screen 220 are connected at the second stance (such as the other one of the first angle and the second angle), the first one and the second one of the two first electric connection ports 113 are respectively connected to the second one and the first one of the two second electric connection ports 124. Thus, regardless whether the base 210 and the screen 220 are connected at the first stance or the second stance, the base 210 and the screen 220 both can be electrically connected through the electric connection port. Besides, the first electric connection port 113 can be realized by an elastic connector (Pogo Pin), a high definition multimedia interface (HDMI) connector, a USB type C connector, a lighting connector, or a display port, and the second electric connection port 124 can be realized by an elastic connector, an HDMI connector, a USB type C connector, a lighting connector, or a display port.

As indicated in FIG. 5A, the two first electric connection ports 113 are vertically symmetric with respect to the center position C1 between the two second engaging portions 121a. As indicated in FIG. 5B, the two second electric connection ports 124 are vertically symmetric with respect to the center position C2 between the two engaging sets 111'. The base 210 and the screen 220 can be assembled along an assembly axial direction L1, wherein the assembly axial direction L1 passes through the center positions C1 and C2. Thus, regardless whether the base 210 and the screen 220 are connected at the first stance or the second stance, the two first electric connection ports 113 can respectively be docked to the two second electric connection ports 124.

In another embodiment, the quantity of the first electric connection port 113 of FIG. 5A can be one, and the quantity of the second electric connection port 124 of FIG. 5B can be one. In the present example, the first electric connection ports 113 are located at the center position C1 on the terminal surface of the protruding portion 121b and are vertically symmetric with respect to the center position C1; the second electric connection ports 124 are located at the center position C2 and are vertically symmetric with respect to the center position C2. Thus, regardless whether the base 210 and the screen 220 are connected at the first stance or the second stance, the first electric connection port 113 also can be docked to the second electric connection port 124.

Although it is not illustrated in the diagram, the display device 200 of FIG. 5A further includes an adaptor. The adaptor of the display device 200 and the adaptor 130 have similar features but are different in that the position and quantity of the third electric connection port 113' of the adaptor of the display device 200 is similar or identical to that of the first electric connection port 113 of FIG. 5A, and the position and quantity of the fourth electric connection port 124' is identical or similar to that of the second electric connection port 124 of FIG. 5A.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
    a screen having a display surface;
    a base having a bottom surface; and
    an adaptor selectively detached from or connected to the screen and the base;
    wherein when the base is connected to the screen through the adaptor, the display device is erected on a plane through the base; when the base and the screen are directly connected, the display device is attached to a wall through the base,
    wherein when the base and the screen are directly connected, the bottom surface and the display surface are parallel to each other.

2. The display device according to claim 1, wherein the base has a bottom surface, and the screen has a display surface; when the screen and the base are indirectly connected through the adaptor, the extending direction of the display surface passes through the bottom surface.

3. The display device according to claim 1, wherein the base has a bottom surface, and the screen has a display surface; when the screen and the base are directly connected, the extending direction of the display surface does not pass through the bottom surface.

4. The display device according to claim 1, wherein the adaptor has an L-shape.

5. The display device according to claim 1, wherein the base comprises a first connector, the screen comprises a second connector, and the adaptor comprises a third connector and a fourth connector; when the screen and the base are indirectly connected through the adaptor, the third connector and the fourth connector are respectively connected to the first connector and the second connector; when the base and the screen are directly connected, the first connector and the second connector are connected.

6. The display device according to claim 5, wherein the first connector and the fourth connector are female connectors having the same structure, and the second connector and the third connector are male connectors having the same structure.

7. The display device according to claim 5, wherein the adaptor comprises a first portion and a second portion, the first portion has a first terminal surface from which the third connector is projected, the second portion has a second terminal surface and a slot recessed to the second terminal surface, and the fourth connector is disposed in the slot.

8. The display device according to claim 5, wherein the first connector and the second connector can be selectively connected by a first angle or a second angle, which differ with each other by 180°.

9. The display device according to claim 1, wherein the screen comprises a screen body and a connector base, and the screen body and the connector base can be pivotally connected.

10. The display device according to claim 1, wherein the base comprises a first connector having two first engaging portions disposed oppositely, and the screen comprises a second connector having two second engaging portions disposed oppositely; one of the two first engaging portions is engaged with one of the two second engaging portions, and the other one of the two first engaging portions is engaged with the other one of the two second engaging portions.

11. The display device according to claim 10, wherein the first connector has two release portions disposed oppositely for dismissing the engaging relationship between the first connector and the second connector.

12. The display device according to claim 1, wherein the base comprises a first electric connection port, the screen comprises a second electric connection port, and the adaptor comprises a third electric connection port and a fourth electric connection port; when the screen and the base are indirectly connected through the adaptor, the adaptor is connected to the first electric connection port and the second electric connection port through the third electric connection port and the fourth electric connection port respectively; when the base and the screen are directly connected, the first electric connection port and the second electric connection port are connected.

13. The display device according to claim 12, wherein the first electric connection port and the third electric connection port have a first identical structure; the second electric connection port and the fourth electric connection port have a second identical structure.

14. The display device according to claim 13, wherein the first identical structure is one of a male connector and a female connector, and the second identical structure is the other one of the male connector and the female connector.

15. The display device according to claim 1, further comprises:
    a control board disposed in the base for controlling the screen.

16. The display device according to claim 1, wherein the base comprises two first electric connection ports, the screen comprises two second electric connection ports; when the base and the screen are connected at a first stance, a first one and a second one of the two first electric connection ports are respectively connected to a first one and a second one of the two second electric connection ports; when the base and the screen are connected at a second stance, the first one and the second one of the two first electric connection ports are respectively connected to the second one and the first one of the two second electric connection ports.

17. A display device, comprising:
a screen having a display surface;
a base having a bottom surface; and
an adaptor selectively detached from or connected to the screen and the base;
wherein when the base is connected to the screen through the adaptor, the bottom surface and the display surface are perpendicular to each other; when the base and the screen are directly connected, the bottom surface and the display surface are parallel to each other.

18. The display device according to claim 17, wherein the adaptor has an L-shape.

19. The display device according to claim 17, wherein the base comprises a first connector, the screen comprises a second connector, and the adaptor comprises a third connector and a fourth connector; when the screen and the base are indirectly connected through the adaptor, the adaptor is connected to the first connector and the second connector through the third connector and the fourth connector respectively; when the base and the screen are directly connected, the first connector and the second connector are connected.

20. The display device according to claim 19, wherein the first connector and the second connector can be selectively connected at a first angle or a second angle, which differ with each other by 180°.

\* \* \* \* \*